United States Patent [19]
Collins et al.

[11] Patent Number: 5,852,696
[45] Date of Patent: Dec. 22, 1998

[54] PACKAGED OPTICAL DEVICE

[75] Inventors: John Vincent Collins, Woodbridge; Roger Alyn Payne, Felixstowe; Adrian Richard Thurlow; Ian Francis Lealman, both of Ipswich, all of United Kingdom; Philip John Fiddyment, Zaragoza, Spain

[73] Assignee: British Telecommunications public limited company, London, England

[21] Appl. No.: 765,644

[22] PCT Filed: Jun. 29, 1995

[86] PCT No.: PCT/GB95/01542

§ 371 Date: Jan. 14, 1997

§ 102(e) Date: Jan. 14, 1997

[87] PCT Pub. No.: WO96/00918

PCT Pub. Date: Jan. 11, 1996

[30] Foreign Application Priority Data

Jun. 29, 1994 [EP] European Pat. Off. ............... 94304755
Mar. 1, 1995 [GB] United Kingdom ................... 9504056

[51] Int. Cl.⁶ .................................................. G02B 6/36
[52] U.S. Cl. ................................. 385/88; 385/94
[58] Field of Search ................. 385/88–94, 14, 385/31, 38, 49, 50; 372/36

[56] References Cited

U.S. PATENT DOCUMENTS

| | | | |
|---|---|---|---|
| 4,411,057 | 10/1983 | Duda et al. | 29/569 |
| 4,466,696 | 8/1984 | Carney | 372/7 X |
| 4,615,031 | 9/1986 | Eales et al. | 372/36 |
| 4,867,524 | 9/1989 | Courtney et al. | 350/96.2 |
| 5,101,464 | 3/1992 | Mousseaux et al. | 385/88 |
| 5,259,049 | 11/1993 | Bona et al. | 385/50 |
| 5,307,433 | 4/1994 | Stein | 385/88 |

FOREIGN PATENT DOCUMENTS

| | | |
|---|---|---|
| 0286319 | 10/1988 | European Pat. Off. . |
| 0419767 A3 | 6/1990 | European Pat. Off. . |
| 0466134 A2 | 1/1992 | European Pat. Off. . |
| 0466134 A3 | 1/1992 | European Pat. Off. . |
| A-0 006 042 | 12/1979 | Germany . |
| U-85 25 398.7 | 12/1988 | Germany . |
| 2184289 | 10/1986 | United Kingdom . |

OTHER PUBLICATIONS

Patent Abstracts of Japan, vol. 6, No. 99 (E–111), 8 Jun. 1982 & JP,A, 57 030394 (Fujitsu) 18 Feb. 1982.
Patent Abstracts of Japan, vol. 10, No. 264 (P–495, 9 Sep. 1986 & JP, A, 61 090108.
Patent Abstracts of Japan, vol. 8, No. 167 (E–258), 2 Aug. 1984 & JP–A–59 061 980 (Hitachi Seisakusho) 9 Apr. 1984.
Zengerle et al, "Fabrication of Optical Beamwidth Transformers for Guided Waves on InP Using Wedge–Shaped Taper Structures", Journal of Vaccuum Science and Technology: Part B, vol. 9, No. 6, Nov. 1992, New York US, pp. 3459–3463.

*Primary Examiner*—Phan T.H. Palmer
*Attorney, Agent, or Firm*—Nixon & Vanderhye P.C.

[57] ABSTRACT

An optical device package includes an optical device held in optically coupled relationship with an optical fibre by a ceramic ferrule. The optical device is mounted on a heatsink, the heatsink being mounted on the ferrule. The optical device is accurately mounted in relation to the rim of the ferrule such that insertion of the optical fibre into the ferrule brings the optical fibre into optically coupled relationship with the optical device without the need for active alignment techniques. The optical device, in use, is encapsulated in silicon sealant to seal the device form the effects of humidity.

23 Claims, 8 Drawing Sheets

PACKAGED OPTICAL DEVICE

BACKGROUND OF THE INVENTION

1. Field of the Invention

The present invention relates to the packaging of an optical device in alignment with an optical fibre.

2. Related Art

The importance of accurate alignment of an optical fibre with other components in optical devices is well known. In an optoelectronic device such as a transmitter or receiver, for example, alignment of an optical fibre with a laser or receiver chip is necessary to attain optimum coupling of light energy. This is especially true for transmitters, where, for example, good optical coupling permits a laser to be operated using minimum current, thus reducing the heat generated during lasing and extending the life of the laser. Thermal expansion problems inherent in transferring heat from the laser are also minimised and, for some applications, packaging costs can be reduced through elimination of the need for a thermoelectric cooler.

In fabrication, not only must the fibre be aligned in three co-ordinates for optimum coupling, but this alignment must also be fixed by a rigid securement and must not be altered by shrinkage forces during fixation or subsequent processing. For a single mode fibre, for example, final alignment must generally be held to within plus or minus one-half micrometer in dimensions radial to the fibre and to within one to two micrometers axially.

Conventionally, packages which incorporate environmentally sensitive components such as lasers, for example, are hermetically sealed to provide the component with a closed and protected environment. It is customary to introduce a communicating optical fibre into such packages via a suitable feed-through connection. In fabrication, the fibre is first inserted into the feed-through and the feed-through is secured to the package. The portion of fibre internal to the package is then aligned with the laser, or other component, and separately fixed in position. U.S. Pat. No. 4615031, for example, discloses one such fabrication technique in which an anchorage clamp welded over the fibre inside the package is used to fix the alignment.

A similar approach to packaging an optical device is described in European patent application EP-A-0286319, where an optical fibre is hermetically sealed in a feed-through tube which is aligned with a laser through an aperture in a wall of a package. The feed-through tube has two supporting points, mounted on an inner surface of the package, at which the tube can be manoeuvred to align it with the optical device. The fibre in the tube is actively optically aligned with the laser by powering up the laser and monitoring the level of light which passes along the fibre as the position of the fibre relative to the laser is altered. When the optimum alignment is achieved, the tube is secured in a fixed relationship to the laser. Using this approach requires that the package and the walls of the package do not deform due to changes in temperature, otherwise the fibre and the optical device could move out of optical alignment.

The cost of packaging optical devices is one of the key economic barriers to the deployment of a FTTH (fibre to the home) telecommunications network, since the devices are responsible for a significant proportion of the cost of the equipment to be installed in subscribers' premises. Of particular significance is the cost of optoelectronic components and assemblies such as, for example packaged semiconductor lasers. The largest component of the cost of, for example, a packaged semiconductor laser is incurred in the packaging of the device and not in the cost of the laser itself. One major cost for the packaging is for the special package or box required to house the laser and the hermetic sealing requirement associated with the package or box to protect the laser from the effects of humidity and other contaminants. Another contribution to the packaging cost is the need to use active fibre alignment techniques (i.e. techniques requiring active monitoring of laser light launched into the fibre during the alignment process) to align the optical fibre with the semiconductor laser.

SUMMARY OF THE INVENTION

For ease of explanation only, the following text refers to the specific case of aligning a laser with an optical fibre. It will nevertheless be appreciated by those skilled in the art that the invention is equally applicable to the alignment of optical fibres with other optical devices, such as detectors, modulators, amplifiers, filters, etc.

In accordance with a first aspect, the present invention provides a packaged semiconductor laser comprising: a semiconductor laser; an optical fibre; and a supporting member, the laser being carried by the supporting member, wherein the optical fibre is held in optically coupled relationship with the laser by the supporting member and the laser device is mounted externally of the supporting member.

Preferably, the optical fibre is bonded to the laser facet with an index matching adhesive, for example an epoxy based adhesive. The fibre may be bonded directly to the laser facet, in which case there would only be a thin layer of bonding adhesive between the fibre and the laser facet. Alternatively, the fibre may be bonded indirectly to the laser facet, for example by bonding a lens or other light transmitting means between the fibre and the laser facet. Attachment of the fibre to the facet, either directly or indirectly, cuts down on undesirable reflections between the facet and the fibre.

Alternatively, reflections between the facet and optical fibre may be minimised by known methods, for example by forming a lens on the end of the optical fibre, anti-reflection coating the end of the fibre, or polishing an angle on the fibre end. However, the method using adhesive has the advantage of adding strength to the assembly.

Preferably, the coupling efficiency between the laser facet and optical fibre is increased by using a high NA fibre, for example a fibre having a NA of greater than 0.25 (compared to a standard fibre having a NA of about 0.1), which has an acceptance angle which better matches the radiation beam angle, typically 30°×40°, of the laser.

Alternatively, the alignment tolerance, and thus coupling efficiency between the laser facet and the optical fibre, is increased by using a large spot size laser (as described in our co-pending European patent application, number 94301309.4, filed on 24 Feb. 1994) which has a large spot size output radiation beam which more closely matches the spot size of standard single mode telecommunications optical fibre (the spot size of a standard single mode telecommunications optical fibre is approximately 10 $\mu$m at a wavelength of 1.55 $\mu$m, whereas the spot size at the output facet of a typical double heterostructure semiconductor laser is 1.0 $\mu$m by 1.5 $\mu$m). A large spot size semiconductor laser is fabricated with a waveguiding structure which has been modified to provide an output which is, typically, larger than a standard semiconductor laser and has less divergence.

Both a high NA fibre and a large spot size laser may be used in combination, however the inventors have shown that the use of a large spot size laser with a standard telecommunications optical fibre provides extremely good coupling efficiency for the present invention of up to 66%.

One purpose of the supporting member is to hold the optical fibre in accurate optical alignment with the laser. This may be achieved in several ways, for example the supporting member may comprise a substrate, into one surface of which is formed a precision V groove reference surface. Preferably the precision V groove is formed by etching, especially by etching a mono-crystalline substrate. The optical fibre would be fixed into the V groove to maintain the alignment of the optical fibre. Additionally, this assembly may be strengthened by inverting another V grooved substrate over the fibre. The laser would be held in optically coupled relationship with the optical fibre against a second reference surface on the supporting member. Alternatively, the supporting member may be a precision ferrule into which the optical fibre is received to maintain its alignment. The internal surface of the ferrule bore provides a reference surface for the optical fibre. Other ways of holding the optical fibre will be apparent in view of the present disclosure.

In a preferred embodiment of the present invention, the supporting member is a ceramic ferrule with dimensions that are accurate enough for it to act as a base for the laser as well as providing a reference surface in the ferrule bore which provides an accurate support for the optical fibre. The rim of the ferrule is used as a reference surface to align the laser with the optical fibre.

Alternatively, the supporting member may be micro-machined into a silicon substrate, wherein the alignment of the laser on the supporting member is achieved by fabricating an alignment bump, typically comprising $SiO_2$, on a reference surface using lithographic mask and etch techniques, which guides the positioning of the laser relative to the end of the fibre which is held by the supporting member. The micro-machined substrate may provide a ferrule-like structure to receive the optical fibre, or it may be a V-grooved substrate for example.

Conventionally, a semiconductor laser needs a heatsink to dissipate heat generated during operation. Preferably, the supporting member itself acts as a suitable heatsink. Alternatively, the laser may be mounted on a device mount, which is itself attached to the supporting member, where the device mount acts as a heatsink alone or in combination with the supporting member. A device mount heatsink would typically be of conventional type, for example one comprising a gold coated diamond onto which the laser is mounted. Typically, however, cost may be reduced by replacing the diamond with, for example, a diamond coated substrate, or a compound such as aluminium nitride or similarly heat-conducting material.

Preferably, electrical contacts for the semiconductor laser are provided as integral parts of the supporting member. Preferably the contacts are also in connection with PCB board pins (integral with the supporting member) to allow the whole packaged device to be mounted readily on a standard PCB arrangement.

In use, the laser is provided with some form of low cost protective cap in order to protect it from humidity and other contaminants. In a preferred embodiment of the present invention, the laser is coated with a silicone sealing gel which acts as such a cap. The inventors have shown that, surprisingly, silicone sealing gels are able to protect the laser from humidity and other contaminants sufficiently well, even for telecommunications applications (where the lifetime requirements are severe), that the lasers need not be contained in a hermetically sealed box, thus removing one of the main packaging cost overheads in known package production.

In embodiments of the invention, the protective cap, for example a silicon sealing gel, is index matching between the optical device and the optical fibre and acts in place of an index matching adhesive to bond the fibre to the device.

In accordance with a second aspect, the present invention provides a method of packaging a semiconductor laser, the method comprising, positioning and mounting a semiconductor laser on a supporting member, and fixing one end of an optical fibre to the supporting member, wherein the semiconductor laser is positioned to be external to the supporting member and in an optically coupled relationship with the optical fibre.

Preferably, the method further comprises the step of bonding the end of the optical fibre to a facet of the laser using an index matching adhesive. Preferably, the adhesive is an adhesive which is curable without the need for heating, for example a UV radiation curable adhesive.

In the case of a semiconductor laser, active alignment may be used to accurately align the semiconductor laser and device mount by turning the laser on and using the laser beam to position the components relative to, for example, the centre of a bore in the optical fibre supporting member, the laser beam, for example, impinging on an optical sensor when the correct position is achieved.

Alternatively, the laser may be passively positioned by a mechanical alignment system, and bonded into position. To obtain precise positioning, the laser is preferably bonded against alignment features, for example one or more groove(s), edge(s), shoulder(s) or bump(s), on the supporting member.

The laser may be manually positioned on the supporting member or, preferably, the laser may be positioned by an automatic placing and bonding machine which applies pressure to the laser to urge it against the alignment features on the supporting member during the bonding of the laser to the supporting member.

A drawback of passive alignment techniques is that the distance from an alignment edge of a laser body to the position of the laser mesa, critically affects the alignment of the laser with the optical fibre. For example, if the distance from the alignment edge to the active area can only be defined to micron accuracy, it may be impossible to optically align the optical fibre and the laser active area with sufficient accuracy by passive alignment techniques, particularly if the optical fibre is single mode.

Hitherto, techniques for fabricating accurately dimensioned laser chips have only achieved accuracies down to 1 micron. Typically, the dimensions of the substrate define the dimensions of the laser chip. These dimensions are typically defined by cleaving planes for single lasers cleaved from a bulk substrate. Therefore, the dimensions of known lasers are determined by how accurate the cleaving process is.

In accordance with a further aspect, the present invention provides a semiconductor laser comprising a semiconductor substrate and, deposited thereon, a plurality of epitaxial layers, wherein at least one of the epitaxial layers has an edge which defines an alignment edge of the laser.

Preferably, the alignment edge of the or each epitaxial layer is defined by a lithographic mask and etch procedure, which typically has an accuracy down to 0.25 $\mu$m.

In a preferred embodiment the alignment edge is separate from the edge of the substrate which latter is defined by a cleave. Therefore, regardless of how accurate or inaccurate the dimensions of the cleaved substrate are, the dimensions of the laser are determined to sub-micron accuracy by the alignment edge defined by the or each epitaxial layer.

Preferably, the alignment edge on the laser co-operates with an alignment feature on a supporting member onto which the laser is to be mounted.

The alignment feature could be in the form of, for example, one or more bumps, or a ridge or ridges, on a reference surface of the supporting member, against which the alignment edge of the laser butts to maintain the laser in a required alignment in relation to the supporting member.

Preferably, the alignment feature on the supporting member is defined by a similar standard lithographic mask and etch procedure, using the same mask as for the alignment edge on the laser, to ensure sub-micron alignment between the finished alignment features on the supporting member and the alignment edge on the laser.

In accordance with a further aspect, the present invention provides a method of fabricating a semiconductor laser, the laser comprising a semiconductor substrate and deposited thereon a plurality of epitaxially grown layers, and an alignment edge, the method including the step of, forming at least one epitaxial layer having an edge determining the position of the alignment edge of the laser.

Conveniently, the epitaxial layer(s) edge, which defines the alignment edge, is formed using a standard lithographic mask and etch procedure suitable for determining the location of the edge of the epitaxial layer(s) to sub-micron accuracy.

Preferably, the epitaxial layer(s) which defines the alignment edge is separate from the edge of the semiconductor substrate, the edge of the substrate typically being defined by a cleave plane.

It will be appreciated that the foregoing references to a semiconductor laser apply, mutatis mutandis, to other semiconductor optical devices, for example detectors, modulators, amplifiers, filters, etc.

BRIEF DESCRIPTION OF THE DRAWINGS

Embodiments of the present invention will now be described in detail, by way of example only, with reference to the accompanying drawings in which.

DETAILED DESCRIPTION OF EXEMPLARY EMBODIMENTS

Figure 1:
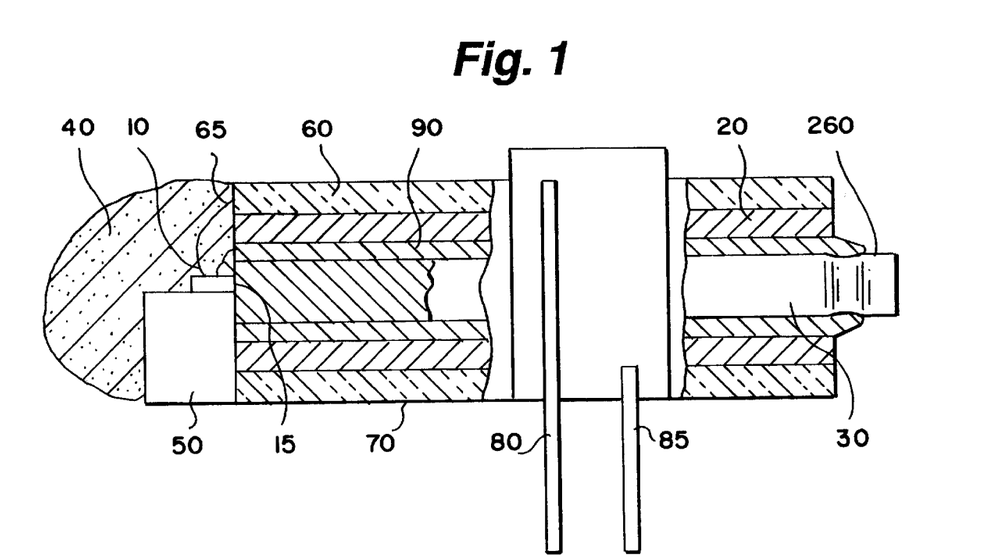
FIG. 1 illustrates a first embodiment of the present invention.

In FIG. 1, the semiconductor laser 10 with a facet 15 is fixed to a heatsink 50 which is in turn fixed on a fibre supporting tube 20. The fixing means comprise a thermally conducting UV-curable adhesive. Such adhesive is used since there is no requirement to heat the device to form a bond as would be the case for solder joints or for thermocompression bonding methods. The supporting tube 20 houses the optical fibre 30, so that the optical fibre is in an optically coupled alignment with the facet 15 of the laser 10. The optical fibre 30 is fixed into the supporting tube with an index matching UV-curable adhesive 90. Electrical contacts 60 and 70 are provided on the tube 20 to facilitate supply of electricity to the laser 10, via an electrical connection 65 and the heatsink 50, respectively. The electrical contacts 60 and 70 are connected to PCB board pins 80 and 85, respectively, which enable simple connection of the laser package to a PCB (not shown). The laser 10 is completely covered in a silicone gel cap 40, for example Wacker (manufacturer) 905, to protect it from humidity and other contaminants.

The fibre support tube 20 is a precision manufactured ceramic ferrule, for example a ferrule available from Kyocera (Japan), which is manufactured to within 1 micron tolerance. The precision of the ferrule 20 enables it to act as a substrate for the whole laser package. Therefore, accurate positioning of the semiconductor laser 10 and the heatsink 50, in relation to the rim on the ferrule 20, enables the optical fibre 30 to be brought into optically coupled alignment with the laser facet 15 by simply inserting the optical fibre into the ferrule. In this way no active alignment is needed to align the optical fibre 30 with the facet 15.

Tests using this arrangement have been carried out and have provided the results shown in Table 1. For these tests, the optical fibre 30 was inserted into the ferrule 20 with the UV-curable adhesive 90. The laser 10 and the optical fibre 30 were aligned using active alignment in which the laser was powered-up and aligned with the fibre 30 on a standard alignment bench. Once aligned, the heatsink 50 was added to support the laser 10, and the heatsink was bonded to the ferrule 20 using UV-cured adhesive by exposing the arrangement to UV radiation. Measurements of optical coupling efficiency were taken at various stages of manufacture of each device, as shown in Table 1.

TABLE 1

| Laser Number | Pre Fixing | Heatsink Fixed | Epoxy Cure |
| --- | --- | --- | --- |
| 1 | 55 | 55.0 | 41.3 |
| 2 | 44 | 47.1 | 45 |
| 3 | 42.5 | 42.5 | 42.1 |
| 4 | 54 | 52.7 | 51.3 |
| Average | | | 44.925 |

In Table 1, 'Laser Number' identifies the laser on test, 'Pre Fixing' is the initial coupling efficiency due to active alignment, 'Heatsink Fixed' is the coupling efficiency when the heatsink was added and 'Epoxy Cure' was the coupling efficiency after the device had been cured.

The results in Table 1 show that the average coupling efficiency is nearly 45%, using a large spot size laser having a theoretical maximum efficiency of 66%.

Subsequent tests have been carried out using a very large spot size laser having a theoretical maximum efficiency of 76%. In these tests, coupling efficiencies in excess of 62% have been achieved. The applicants believe that coupling efficiencies approaching the theoretical maxima for the laser davices will be possible by fine-tuning the manufacturing process.

Figure 2:
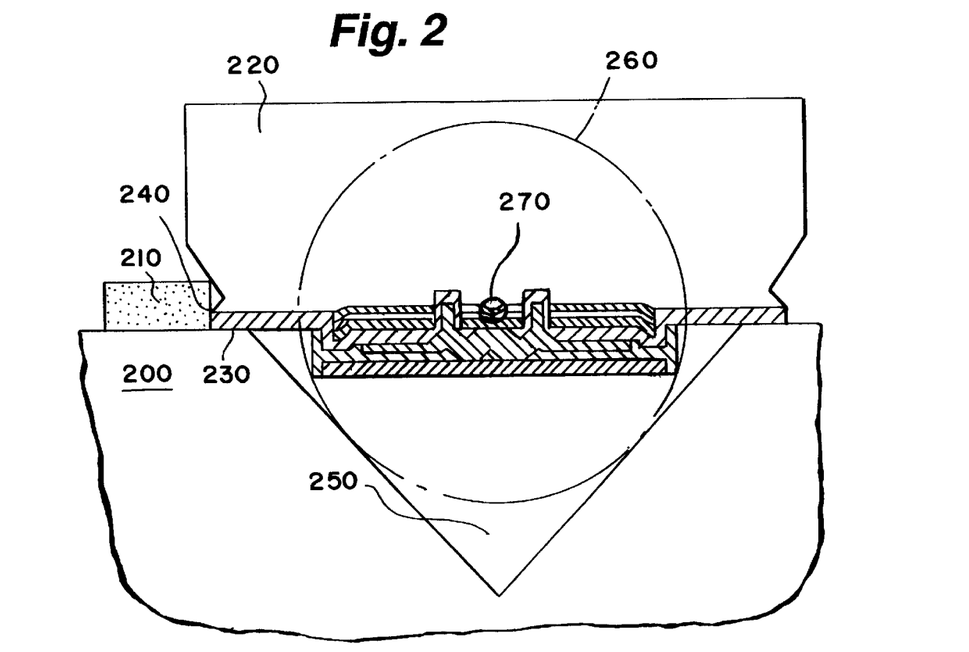
FIGS. 2 and 3 illustrate a second embodiment of the present invention, in front elevation and exploded view respectively.
Figure 3:
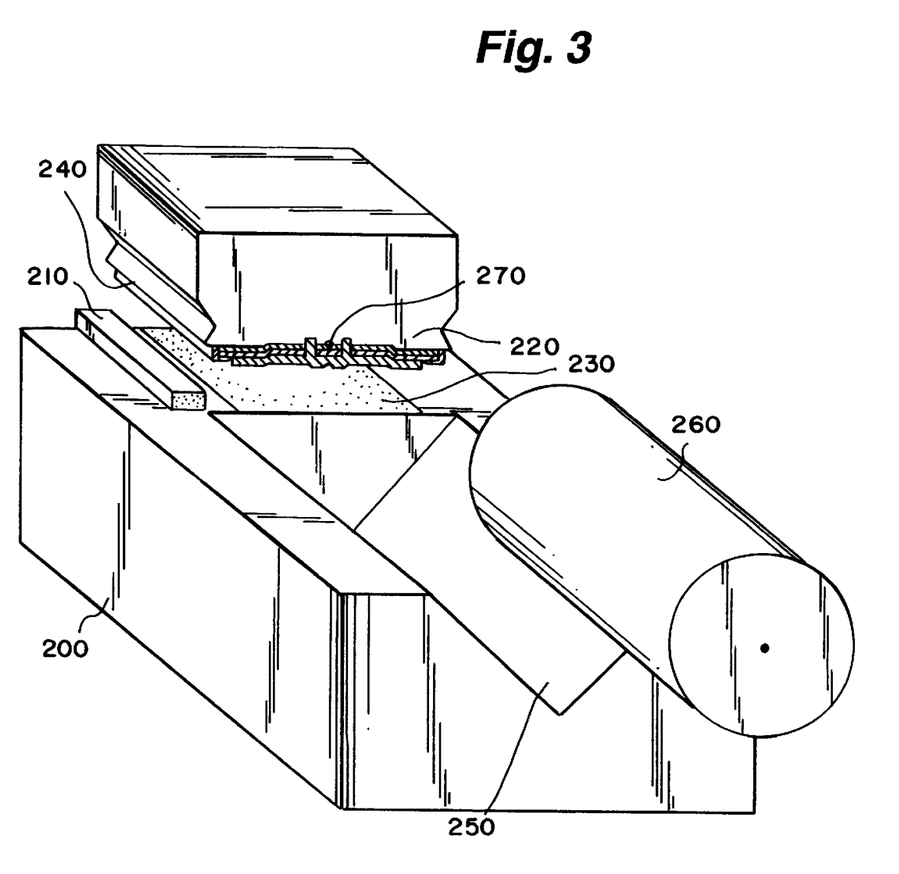

FIG. 2 shows a second embodiment of a packaged semiconductor laser according to the present invention, which is shown in exploded view in FIG. 3. The drawings show a silicon supporting member, or sub-mount, 200 which includes a $SiO_2$ alignment ridge 210 against which a semiconductor laser chip 220 is aligned. An advantage of using silicon for the sub-mount 200 is that it can be etched accurately taking advantage of its anisotropic properties to provide accurate etch depths and etch angles. A solder pad 230 is plated onto the submount 200, onto which the laser chip 220 is mounted. The solder pad 230 provides thermal and electrical contact for the laser chip 220 as well as providing a fixing to hold the chip in place. The laser chip 220 has a precision alignment edge 240 which butts against the $SiO_2$ alignment ridge 210 to ensure accurate alignment of the laser chip 220 in relation to the sub-mount 200. A precision V groove 250, which is etched into the sub-mount 200, extends from one edge of the sub-mount 200 to the edge of the laser chip 220. The V groove 250 has a depth such that an optical fibre 260 received in the V groove optically aligns with the laser chip 220. The V groove 250 is formed using known masking and anisotropic etching techniques. The optical fibre 260 is bonded into the V groove 250 using an index matching UV curable adhesive or other suitable known adhesive.

As indicated previously, it is desirable to be able to employ a passive rather than an active alignment technique. Passive alignment techniques can be used with the above identified embodiments provided that the laser chip alignment edge is an accurately defined distance from the light emitting area of the laser facet, or mesa. Hitherto, techniques for fabricating accurately dimensioned laser chips have only achieved accuracies down to 1 micron. However, the inventors have developed a technique for fabricating laser chips with sub-micron dimension accuracy. This method finds particular application in fabricating lasers for use in the present invention, but is also of more general application.

Figure 4A:
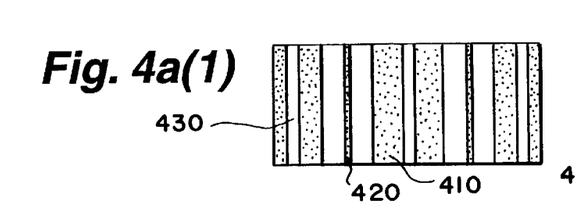
FIGS. 4a to 4i, 4a(1), 4a(2) and 4b(1) illustrate the steps involved in fabricating a semiconductor laser chip for use in the second embodiment.

The process for fabricating sub-micron accuracy, pn diode laser chips is described, by way of example only, with reference to FIGS. 4a to 4i. FIGS. 4a 4a(1) and 4a(2) show a InP substrate 400, with two epitaxially grown surface layers 402 and 404 and a layer 410 of silicon dioxide ($SiO_2$), which has been etched to form an outline from which the laser chip is to be fabricated. In FIGS. 4a to 4i, the layers 402 and 404 (shown inset in FIG. 4a(2) and 4b(1)) are represented as a single, un-shaded layer for clarity.

The substrate 400 is typically S-doped to a level of between $3 \times 10^{18} cm^{-3}$ and $1 \times 10^{19} cm^{-3}$. The layers comprise an $In_wGa_xAs_yP_z$ quaternary active (Q-active) layer 402, typically 0.15 $\mu$m thick, which is capped with a protective InP layer 404, typically 50 nm thick, doped with Zn to a level of around $5 \times 10^{17} cm^{-3}$. The wavelength at which the laser chip eventually lases is determined by the ratio of component amounts in the Q-active layer. Typically, to lase at 1300 nm, the component ratios for w:x:y:z would be:- 0.74:0.26:0.56:0.44, or at 1550 nm, the ratios would be:- 0.61:0.39:0.83:0.17. The etching was carried out, using standard photolithographic and etching procedures, by coating the substrate in $SiO_2$ 410 and covering the $SiO_2$ with a standard positive photo-resist, typically a chromium coated quartz glass, to define outline areas for a buried heterostructure (BH) laser mesa 420 (~3.5 $\mu$m wide) and V groove apertures 430 (~5.0 $\mu$m wide) on the substrate 400. The outline was firstly etched into the $SiO_2$, 410 typically using a standard reactive ion etch (RIE), for example $CF_4$ plasma @ 10 mT and 150 w, or a wet etch in HF based etchant, for example 10:1 buffered HF (isoclean grade @ 20° C.). The remaining $SiO_2$ 410 was then used as a mask to etch the underlying semiconductor 400 to a depth of approximately 1.0 $\mu$m, using a suitable crystallographic etchant, for example a crystallographic wet etch of 14:1:9 {DI $H_2O$: (17:1 $HBr:Br_2$):HBr} @ 5° C., or an RIE of $CH_4$/H2 plasma @ 70 mT and 200 w. The remaining photo-resist was removed using, typically, acetone followed by concentrated sulphuric acid. At this stage, the distance from the centre of the laser mesa 420 to the edge of the V groove aperture 430 is defined by the accuracy of the photolithographic process, which is typically within +/−0.25 $\mu$m accuracy.

Figure 4B:
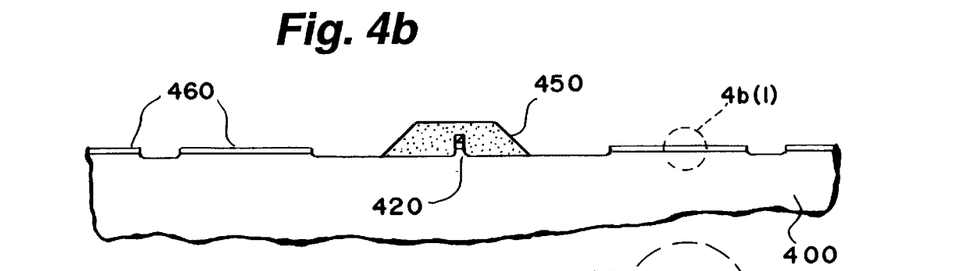
Figures 4B, 4C:
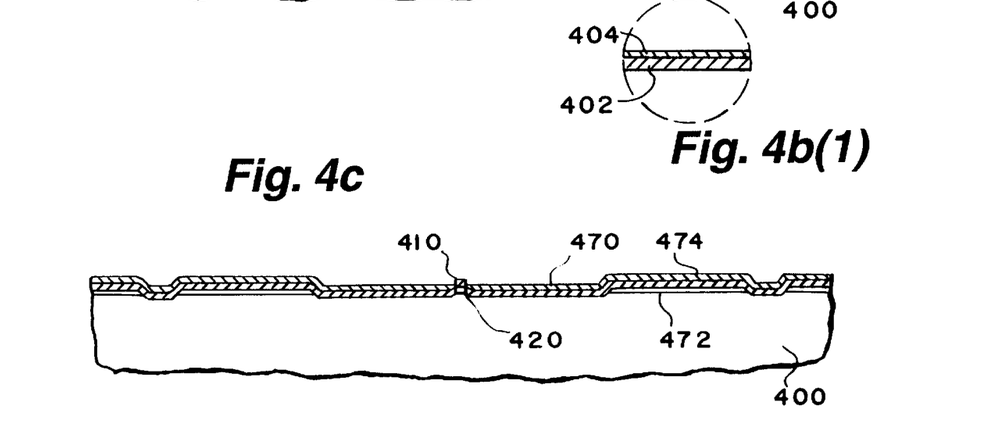
Figure 4D:
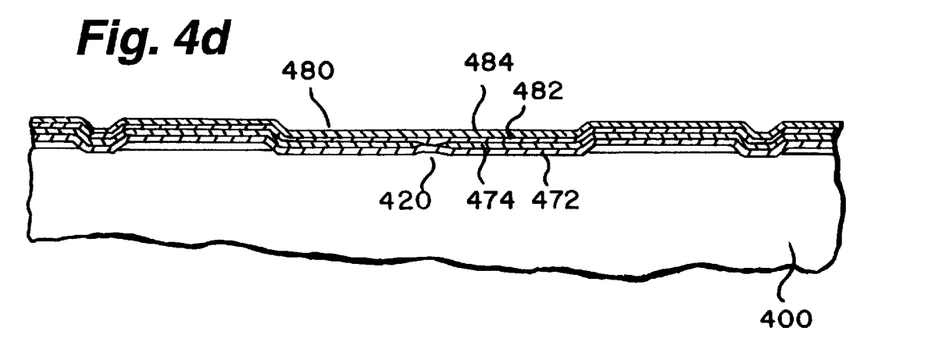

FIG. 4b shows the second stage of fabrication in which the laser mesa 420 is protected with a suitable protective resist 450, typically chromium coated quartz glass, whilst the remaining $SiO_2$ 410 is removed with $CF_4$ from plateau regions 460 left after the first stage of photolithography, leaving the InP cap layer 404 exposed. First and second stages of overgrowth are shown in FIGS. 4c and 4d in which a conventional blocking structure 470 and contact layers 480 are epitaxially grown onto the structure respectively.

The blocking layer comprises two layers, one of p-InP 472, typically 0.5 $\mu$m thick, doped with Zn to a level of $5 \times 10^{17}$ and one of n-InP 474, typically 0.4 $\mu$m thick, doped with S to a level of $1-2 \times 10^{18}$. The blocking layers are arranged in reverse bias to the n-type and p-type layers of the pn diode laser chip (usually with the n-type layer on top).

The contact layer 480 comprises two layers, one of Zn-doped InP 482 (which in fact comprises two layers:—a lower layer 0.7 $\mu$m thick, doped to a level of $5 \times 10^{17}$, and an upper layer 0.7 $\mu$m thick, doped to a level of $1-2 \times 10^{18}$). The other contact layer 484 is of InGaAs, 0.1 $\mu$m thick, doped to a level of $>4 \times 10^{19}$, to provide a near metallic p++ surface layer for electrical contact.

The InGaAS contact layer 484 is then patterned lithographically (FIG. 4e) to reduce the current path and minimise capacitance effects by etching areas of the contact layer away. This is achieved using an $SiO_2$ mask 486 and etching the InGaAs in a wet etch, comprising:—$H_2SO_4$ (1 part); $H_2O_2$ (1 part) and $H_2O$ (25 parts).

Figure 4E:
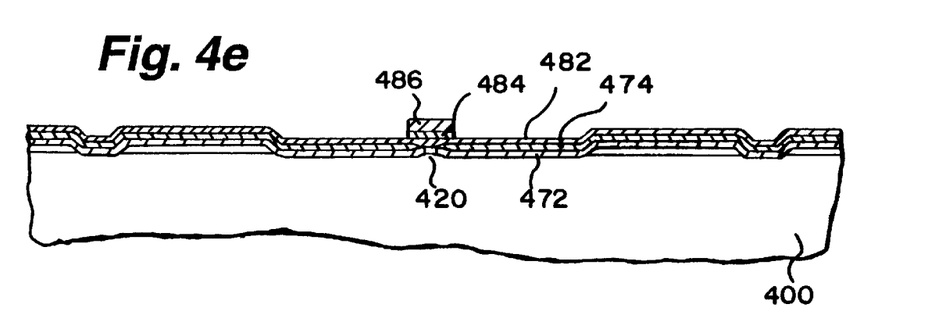

In practice, the patterning removes all but a small area of the InGaAs layer 484, leaving an area typically 15 $\mu$m wide above the mesa 420.

Figure 4F:
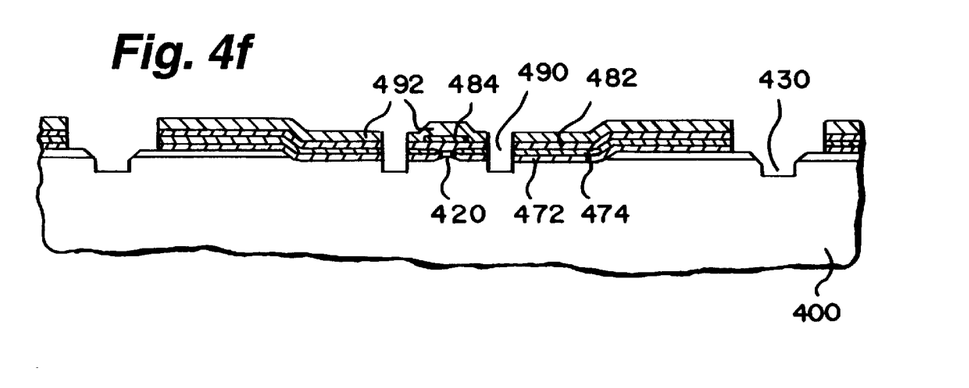

The next stage is trenching, as shown in FIG. 4F, where trenches 490 are etched either side of the laser mesa 420, using a suitable mask 492, typically $SiO_2$, and etchant, for example a wet etch, comprising:—$H_3PO_4$ (4 parts) and HCl (1 part). The operating speed of a BH semiconductor laser is dependant on many factors, the capacitance of the blocking structure being one of the more important. The trenches isolate the mesa 420 from capacitance effects due to the overall blocking structure 470, thus permitting high speed laser operation in the absence of such capacitance effects.

After the trenching stage, the masking $SiO_2$ 492 is removed from the slice and the slice is re-coated in a fresh layer of $SiO_2$ 502. A contact window ~10 $\mu$m wide is then opened over the laser mesa to allow electrical contact to be made to the laser. During this process, windows over the V groove apertures 430 are again opened.

Figure 4G:
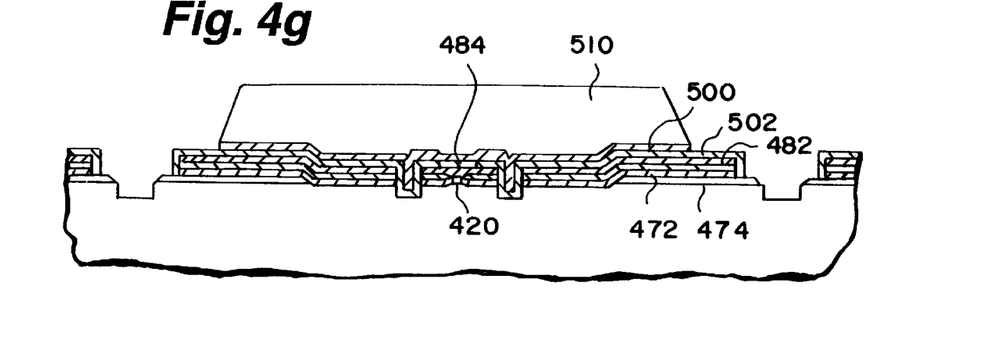

FIG. 4g shows formation of p side contact metalisation (TiAu) for the electrical contact windows 500 and the protection of the windows with a layer of resist 510, for example a standard positive photo-resist such as Hoechst AZ5214E, as the mask for a further patterning step. The Au layer is etched in a wet etchant based on KI and the Ti is etched by RIE in a $CF_4$ plasma using standard conditions. The same metalisation is plated onto the bottom of the slice (not shown) to form the n side contact, after the slice bas been thinned to ~90 $\mu$m using a standard wet etchant (Br/methanol).

Figure 4H:
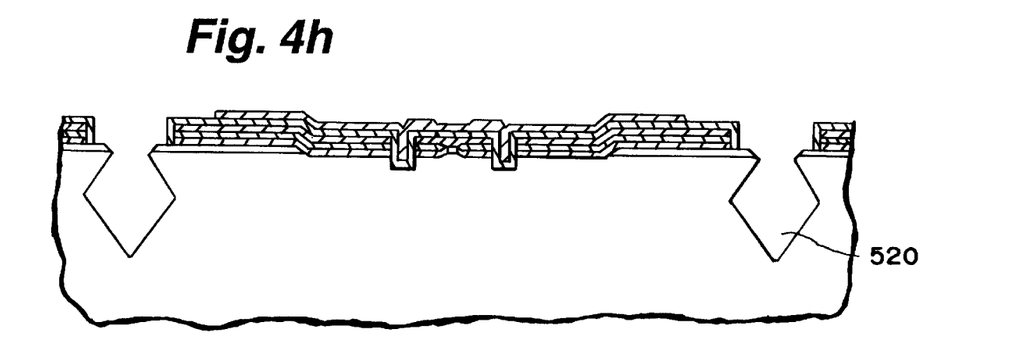

Note: during the V groove etching (described below), using HBr, the resist mask used to pattern the p metal is left on the metal to act as a protective layer and is removed after the V grooves have been etched.

Figure 4I:
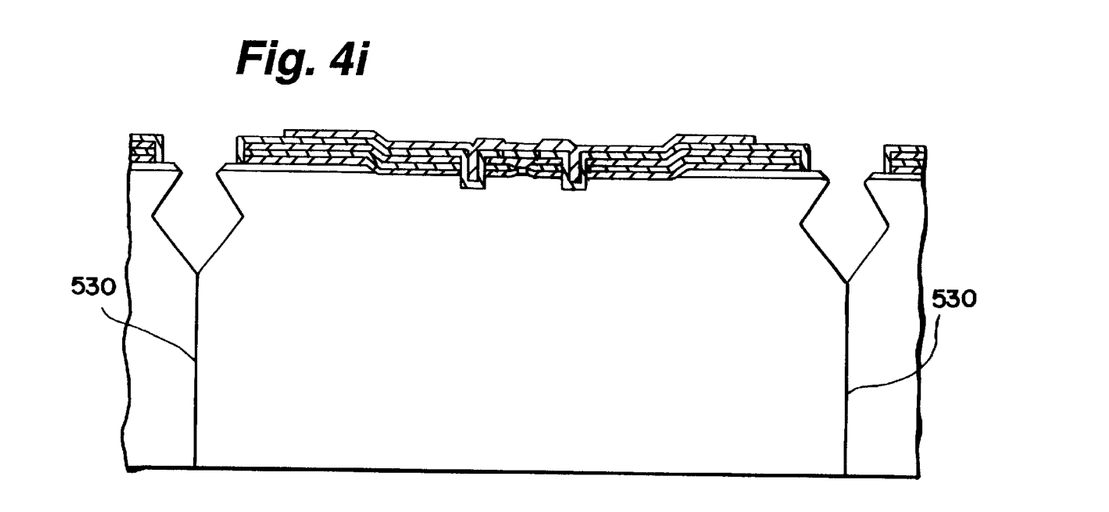

FIG. 4h shows how the V grooves 520 are further etched using HBr which erodes the InP substrate but not the Q-layer 402. The apertures 430 at the mouths of the V grooves 520, and hence the distance between the edge of the V groove and the mesa 420, are accurately defined to within 1 μm by the previously etched Q-layer 402 which was defined in the first stage (FIG. 4a). The V groove 520 profile has a diamond shape, resulting from crystallographic etching properties of HBr in the <110> InP crystal direction. FIG. 4i shows the resulting structure with cleave planes 530 defined at the bottoms of the V grooves 520.

Figure 5:
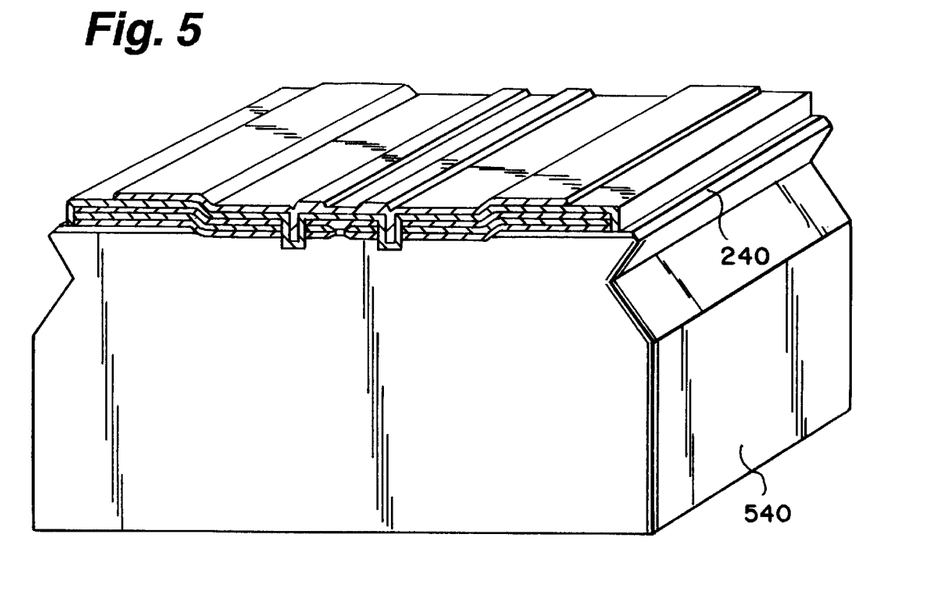
FIG. 5 shows a front elevation of a cleaved laser chip fabricated by the steps according to FIGS. 4a to 4i.

Once cleaved, as shown in FIG. 5, this structure provides two possible alignment mechanisms for the laser chip. Firstly, there is the Q-edge 240, which potentially provides sub-micron accuracy between the centre of the laser mesa 420 and the Q-edge 240. Secondly there is the cleavage plane 530 emanating from the bottom of the V groove 520, which should be accurate to within 1 micron.

Alternative cleaving arrangements used to cleave laser chips can take advantage of the fact that the cleaving mechanism is no longer an essential feature of the alignment process, if the Q-edge (which is not cleaved) is used for alignment.

Figure 6:
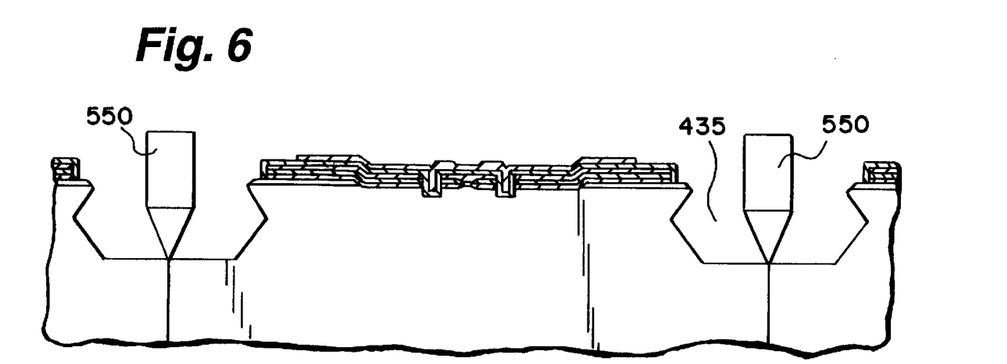
FIG. 6 shows an alternative chip fabrication layout for the steps illustrated in FIGS. 4a to 4i.

Thus, FIG. 6 shows much wider apertures 435 (~50 μm wide) which can easily be fabricated on the semiconductor. In this case the laser chips would be separated by cleaving in the conventional way using a diamond scribing tool 550, however the accurate non-cleaved alignment edge would then be the one used for actual alignment purposes.

In practice the relevant parts of the same mask would be used for etching the sub-mount and the laser chip substrate, to ensure that they matched in terms of accurately aligning the laser chip with the sub-mount.

Figure 7:
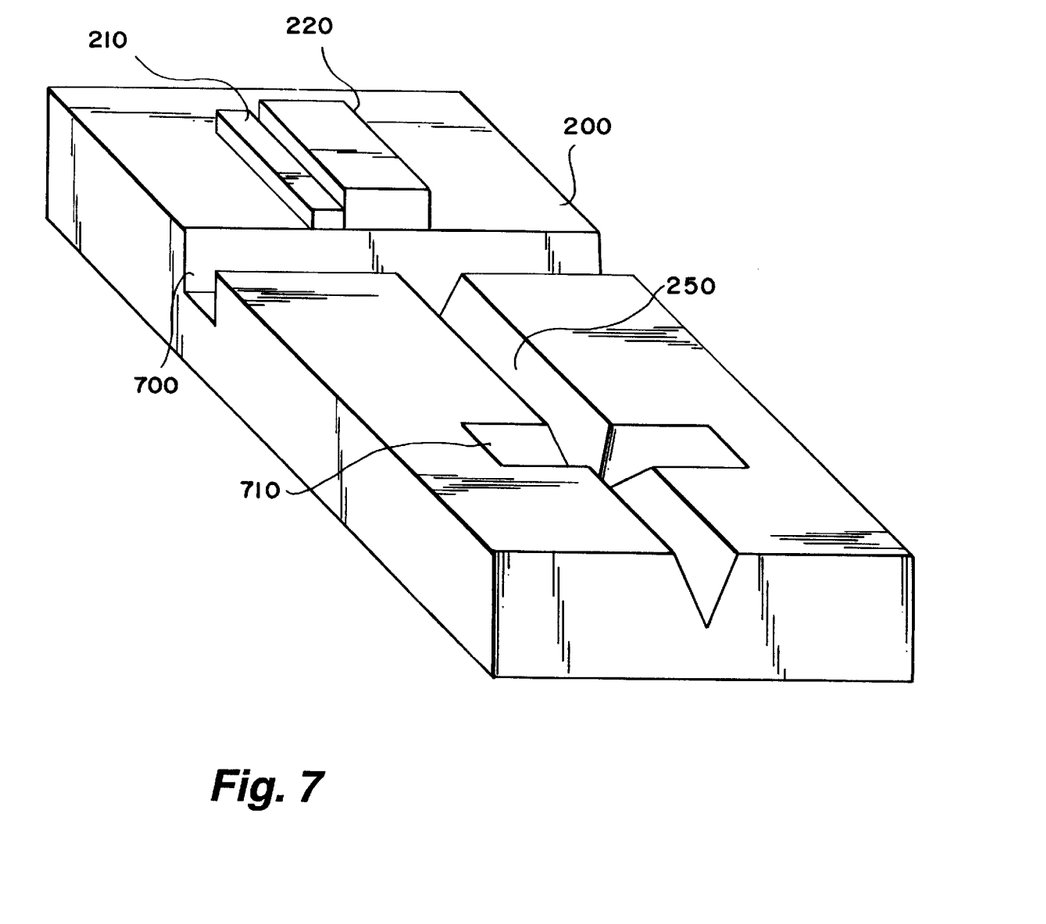
FIG. 7 shows in more detail an example of the second embodiment.

FIG. 7 shows in more detail an example of the invention described above in relation to FIGS. 2 and 3. A 1550 nm Fabry-Perot laser 220 is shown mounted on a micro-machined silicon optical bench 200. The laser 220 is a large spot size laser which has an 8 well compressive strained active layer, the planar design having been previously reported in the Applicant's prior patent application number 94301309.4.

The first stage of the photolithography for the laser is used to define both the passive guide (not shown) of the large spot size laser and channels (not shown) at the edge of the device which define scribe lanes 435 by which multiple lasers fabricated on a common substrate can be separated. A precision cleaved edge 240 of a scribe lane may be defined by this method to an accuracy of about ±0.2 μm.

In this embodiment, scribe lanes 435 buried by further layers resulting from subsequent fabrication steps are exposed and the scribe lanes etched using 4:1 $H_3PO_4$:HCL. The result of this etching is a substantially U-shaped channel approximately 20 μm deep and 5 μm wide, the precision cleaved edges 240, or top corners, of which are defined by a 1.1 μm quaternary of the passive guide of the laser. The fabricated devices are cut from a common substrate into devices 1.1 mm long by 300 μm wide (defined by the scribe lanes). The length of the device comprises 340 μm of un-tapered active region, a 460 μm tapered region and a 300 μm passive region.

Optimised coupling measurements of a number of devices, manufactured according to the above method, mounted on conventional headers yielded coupling efficiencies of up to 62% to cleaved ended single mode optical fibre.

In FIG. 3, the laser device 220 is mounted on the silicon optical bench 200 with an intervening solder bond-pad 230 which provides thermal and electrical contact between the laser 220 and the silicon optical bench 200. The laser 220 is aligned by butting the precision quaternary edge 240 against a silica ($SiO_2$) alignment stop 210, said stop having previously been formed on the bench as described below.

Silicon micro-machining techniques are used to fabricate the silicon optical bench 200 on which the laser 220, is passively aligned. The main features of the silicon optical bench 200 are a V-groove 250 for fibre attachment and a silica stop 210 against which the precision cleaved edge 240 of the laser chip 220 is aligned. The silica stop 210 is 15 μm high and is formed by plasma enhanced chemical vapour deposition and etched by a combination of reactive ion etching and wet chemical etching. The solder bond-pad 230 is formed by e-beam evaporation of 50 nm titanium, 200 nm platinum and 200 nm gold, and is patterned using lift-off. 3 μm gold-tin solder is then thermally evaporated onto the resulting metal bond-pad 230, and is also patterned using lift-off. The fibre V-groove 250 is formed by anisotropic etching of <100> silicon wafers using ethylene diamine and pyrocatechol, using a silicon nitride mask. The V-groove 250 has a depth such that the core of a suitable single mode optical fibre 260 substantially optically aligns with the laser. The exact depth of the V-groove 250 in practice is determined by experiment with the etchants, silicon substrate and optical fibre 260 used.

A groove 710 is etched perpendicular to the V-groove 250 to enable glue used to hold the fibre 260 in place to flow freely underneath the fibre. Also, a shallow saw-cut 700 is made at the end of the V-groove 250 adjacent the laser 220 to remove the sloping end face of the V-groove, which remains after the V-groove is etched. This to allows the fibre 260 to be brought close to the laser 220 facet.

Fabrication of the package is as follows. The laser 220 is bonded against the silica alignment stop 210 on the silicon bench 200 using a conventional laser die bonder. A cleaved single mode optical fibre 260 is then laid in the V-groove 250 on the optical bench 200 and is glued in place with a UV-cured adhesive. Further to this, a lid (not shown) made from a piece of silicon with an etched V-groove is applied over the top of the fibre 260 to clamp the fibre firmly in place and to provide rigidity.

A number of packaged laser devices according to FIG. 7 have been manufactured as described above. Also, a number of laser chips from the same wafer were separated and were bonded, junction side down, on diamonds on conventional headers for the purposes of performance comparison. These diamond-mounted arrangements were found to have very uniform characteristics. Their output powers at 50 mA and 20° C., were found to be in the range of 5–6 mW.

The coupling efficiencies of the devices on the silicon optical benches were estimated by comparing the output power in the single mode fibre at 50 mA and 20° C., to the average value of 5.5 mW. Using this technique, coupling efficiencies as high as 55% have been calculated.

Figure 8:
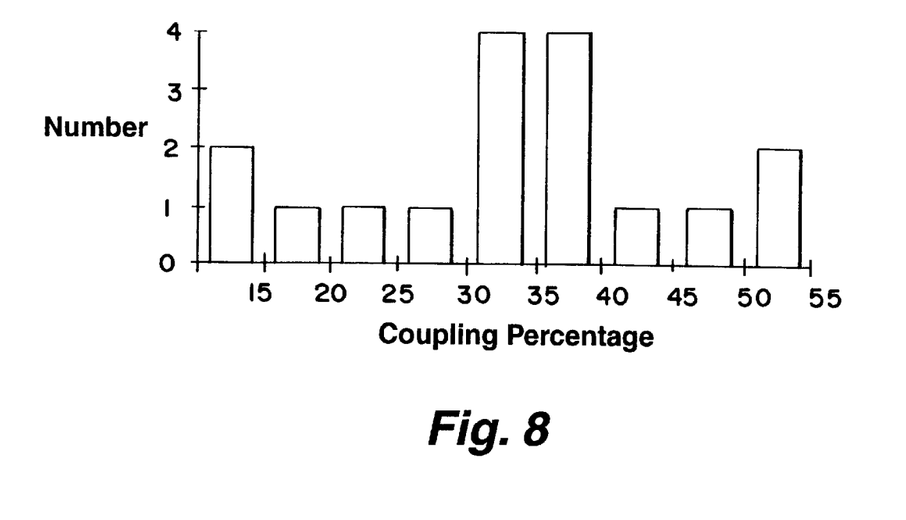
FIG. 8 is a graph of coupling results achieved for packages according to the second embodiment.

As shown in FIG. 8, reproducible yields of packaged devices according to the invention have been demonstrated, mainly having coupling efficiencies greater than 30%, but significantly there is a substantial yield at greater than 50% efficiency.

Figure 9:
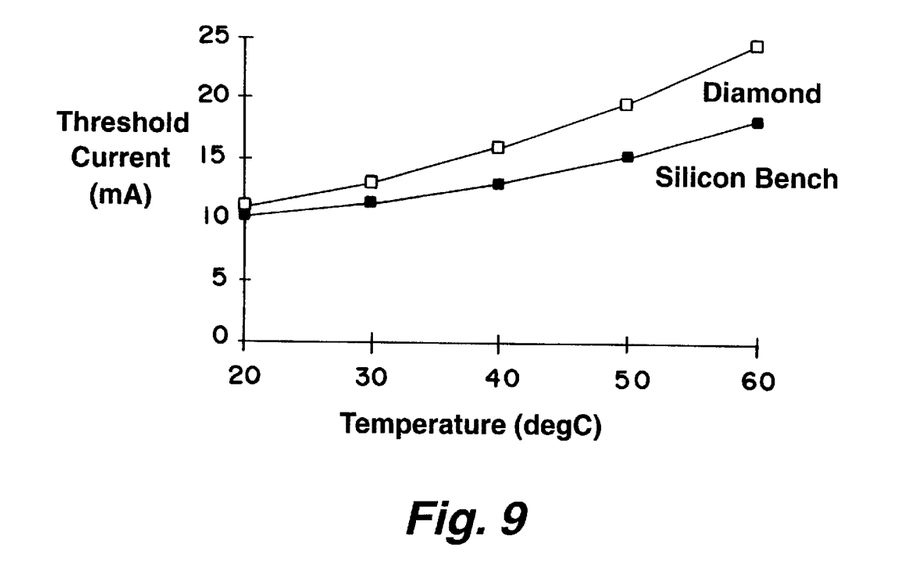
FIG. 9 is a graph of a comparison between the heatsinking performance of the second embodiment of the invention and a standard diamond heatsink.

As can be seen from FIG. 9, the thermal properties of the lasers on the silicon bench compare favourably with the test devices bonded on diamonds. It is suggested that the larger footprint of the silicon bench compared with the diamond mounting compensates for the lesser thermal conductivity of the silicon.

Initial assessment of the modulation capability of a device according to this invention shows back to back bit error rate measurements indicating that the device is capable of modulation at rates in excess of 300 MBit/s.

The skilled person will appreciate that the combination of low-cost packaging, high coupling efficiency and bandwidth in the packaged laser according to the present invention shows this to be a viable technology for fibre-to-the-home (FTTH).

While the laser chip fabrication technique described above finds particular application in the method of forming a packaged semiconductor laser device according to the present invention, it will be apparent that the technique finds important application in the general field of semiconductor device fabrication and alignment. In particular, the method is not limited to the steps described above for fabricating a standard pn diode laser. The method finds application in the fabrication of other types of laser, for example MQW lasers or large spot size lasers, or indeed any type of semiconductor device which requires sub-micron alignment. Thus the precise details of layer composition, doping, thickness and of overall device dimensions are given by way of example only. Other devices, whether laser or otherwise, according to this aspect of the invention will typically have very different characteristics to those described above. In particular, the quaternary layer which provides the non-cleaved alignment edges also provides the device's active layer. In other devices, the equivalent layer might well not be a quaternary, possibly being a ternary, binary or other composition. Moreover, the layer which provides the non-cleaved alignment edge might be one other than that which provides the device's active layer—indeed the device may have no readily identifiable active layer. Nevertheless, the application of this aspect of the present invention to the easing of alignment problems will be clear to those skilled in the art.

What is claimed is:

1. An optical device package comprising:
   an optical device,
   a first support member supporting the optical device,
   a second support member having a bore and an optical fibre received in said bore,
   the second support member carrying the first support member such that the optical device and the optical fibre are in optically coupled relationship, and
   an encapsulant applied to the optical device to seal the optical device from the surrounding environment.

2. An optical device package as in claim 1 wherein the second support member is a ferrule.

3. An optical device package as in claim 1 wherein the second support member comprises a substrate having a micro-machined bore.

4. An optical device package comprising:
   an optical device,
   an optical fibre optically coupled to said optical device,
   means to support the optical fibre and the optical device, and
   an encapsulant material applied directly onto the optical device to seal the optical device from the surrounding environment.

5. An optical device package as in claim 4 wherein the encapsulant comprises a silicone sealant.

6. An optical device package as in claim 4 wherein the sealing compound is index-matching and forms a bond between a facet of the optical device and the end of the optical fibre.

7. An optical device package as in claim 4 wherein the optical fibre has a numerical aperture greater than 0.25.

8. An optical device package as in claim 4 wherein the optical device is a semiconductor laser having a waveguiding structure to provide an output which substantially matches the fundamental mode spot size of a single mode optical fibre.

9. An optical device package comprising:
   a ferrule,
   an optical fibre received in the bore for the ferrule,
   a support member supported against the rim of the ferrule at one end thereof,
   an optical device carried by said support member in optically coupled relationship with said optical fibre, and
   an encapsulant material applied directly onto said optical device to seal the optical device from the surrounding environment.

10. A method of packaging an optical device, the method comprising the steps of:
   a) mounting an optical fibre on or in an optical fibre supporting member;
   b) positioning the optical device in optical alignment with the optical fibre and securing the device and the fibre in optically coupled relationship; and
   c) applying an encapsulant material directly onto the device to form a substantially air-tight seal.

11. A packaged optical device comprising:
   an optical device and optical fibre supported in an optically coupled relationship by at least one separately formed support member; and
   an encapsulant material adhered directly around and to at least otherwise exposed portions of the optical device to seal it hermetically from ambient environmental conditions.

12. A packaged optical device as in claim 11 wherein said at least one separately formed support member comprises a ceramic ferrule into one end of which one end of said optical fiber is inserted and having said optical device mounted externally of the ferrule at its other end.

13. A packaged optical device as in claim 12 wherein said support structure further comprises a heat sink member also affixed externally to said other end of the ferrule.

14. A packaged optical device as in claim 11 wherein said at least one separately formed support member comprises a micro-machined silicon optical bench including a photolithographically formed abutment for positioning said optical device with respect to an etched V-shaped groove that carries the optical fiber.

15. A packaged optical device as in claim 14 including a mounting pad on said optical bench for affixing said optical device thereto after it has been abutted against said abutment.

16. A packaged optical device as in claim 11 further comprising:
   a pair of PCB electrical contact pins electrically connected to said optical device and physically supported by said support member.

17. A packaged optical device as in claim 11 wherein said encapsulant comprises a solidified silicon gel sealant.

18. A method for making a packaged optical device, said method comprising:

positioning and affixing an optical device and optical fibre in an optically coupled relationship on a separately formed support member;

embedding otherwise exposed portions of the optical device within a directly adhered encapsulant material to seal it hermetically from ambient environmental conditions.

19. A method as in claim 18 wherein said separately formed support member comprises a ceramic ferrule into one end of which one end of said optical fiber is inserted and having said optical device mounted externally of the ferrule at its other end.

20. A method as in claim 19 further comprising affixing a heat sink member externally to said other end of the ferrule.

21. A method as in claim 18 including micro-machining said separately formed support member as a silicon optical bench including a photo-lithographically formed abutment for positioning said optical device with respect to an etched V-shaped groove that carries the optical fibre.

22. A method as in claim 21 including affixing said optical device to a mounting pad on the optical bench after it has been abutted against said abutment.

23. A method as in claim 18 further comprising:

electrically connecting a pair of PCB electrical contact pins to said optical device and physically affixing said pins for support by said support member.

* * * * *